(12) United States Patent
Aoki et al.

(10) Patent No.: US 12,328,958 B2
(45) Date of Patent: Jun. 10, 2025

(54) RADIOGRAPHIC DEVICE

(71) Applicants: NATIONAL UNIVERSITY CORPORATION SHIZUOKA UNIVERSITY, Shizuoka (JP); ANSeeN Inc., Shizuoka (JP)

(72) Inventors: Toru Aoki, Hamamatsu (JP); Katsuyuki Takagi, Hamamatsu (JP); Akifumi Koike, Hamamatsu (JP); Tetsuya Iida, Hamamatsu (JP); Tomohiko Kosugi, Hamamatsu (JP)

(73) Assignees: NATIONAL UNIVERSITY CORPORATION SHIZOUKA UNIVERSITY (JP); ANSEEN INC. (JP)

( * ) Notice: Subject to any disclaimer, the term of this patent is extended or adjusted under 35 U.S.C. 154(b) by 72 days.

(21) Appl. No.: 18/247,914

(22) PCT Filed: Oct. 6, 2020

(86) PCT No.: PCT/JP2020/037867
§ 371 (c)(1),
(2) Date: Apr. 5, 2023

(87) PCT Pub. No.: WO2022/074733
PCT Pub. Date: Apr. 14, 2022

(65) Prior Publication Data
US 2023/0378229 A1 Nov. 23, 2023

(51) Int. Cl.
*H10F 39/18* (2025.01)
*G01T 1/24* (2006.01)
(Continued)

(52) U.S. Cl.
CPC .......... *H10F 39/1895* (2025.01); *G01T 1/24* (2013.01); *H10F 39/811* (2025.01); *G01T 1/2018* (2013.01)

(58) Field of Classification Search
CPC ......... H01L 27/14661; H01L 27/14636; H01L 27/14658; G01T 1/24; G01T 1/2018; G01T 1/241; G01T 1/247
See application file for complete search history.

(56) References Cited

U.S. PATENT DOCUMENTS

2013/0032389 A1* 2/2013 Tokura ................ G01T 1/20184
174/264

FOREIGN PATENT DOCUMENTS

JP 2003-264280 A 9/2003
JP 2003-282849 A 10/2003
(Continued)

OTHER PUBLICATIONS

English translation of the International Preliminary Report on Patentability (IPRP) (Chapter 1 or II of the PCT Treaty) mailed Apr. 20, 2023 with a Notification from the International Bureau (Form PCT/IB/338) in corresponding PCT International Application No. PCT/JP2020/037867.
(Continued)

*Primary Examiner* — Kiho Kim
(74) *Attorney, Agent, or Firm* — OSTROLENK FABER LLP (57) ABSTRACT

A radiation imaging device includes a radiation detector having an electric charge generation part configured to generate an electric charge corresponding to energy of incident radiation and a reading part configured to output a digital value based on the electric charge, and a circuit board in which a plurality of radiation detectors are disposed two-dimensionally. The reading part includes a lead-out substrate in which a plurality of signal processing parts are disposed two-dimensionally, and an intermediate substrate disposed between the electric charge generation part and the lead-out substrate. A plurality of first intermediate electrodes are disposed on an intermediate input surface. A plurality of (Continued)

second intermediate electrodes are disposed on an intermediate output surface. An arrangement interval of the second intermediate electrodes is different from an arrangement interval of the first intermediate electrodes.

6 Claims, 8 Drawing Sheets

(51) Int. Cl.
     *H10F 39/00*     (2025.01)
     *G01T 1/20*     (2006.01)

(56) References Cited

FOREIGN PATENT DOCUMENTS

| JP | 2007-155562 A | 6/2007 |
|---|---|---|
| JP | 2011-226817 | 11/2011 |
| JP | 2012-009607 A | 1/2012 |

OTHER PUBLICATIONS

International Search Report mailed Dec. 8, 2020 in corresponding PCT International Application No. PCT/JP2020/037867.

\* cited by examiner

RADIOGRAPHIC DEVICE

CROSS-REFERENCE TO RELATED APPLICATION

The present application is a 35 U.S.C. §§ 371 national stage application of International Application No. PCT/JP2020/037867, filed Oct. 6, 2020, the contents of which are incorporated herein by reference.

TECHNICAL FIELD

The present invention relates to a radiation imaging device.

BACKGROUND ART

A technology for detecting radiation has been developed. The radiation detection technology is expected to be applied to the medical field, industrial field, security field, and the like. As an apparatus for detecting radiation, there is a radiation imaging device for obtaining a radiation image. For example, a radiation imaging device disclosed in Patent Literature 1 includes a radiation detection element and an integrated circuit element. The radiation detection element is a separate component from the integrated circuit element. The radiation detection element is located above the integrated circuit element. Then, a back surface of the radiation detection element and a main surface of the integrated circuit element are electrically connected by a plurality of electrodes. A sensor that employs a structure in which a detection element and a circuit element are stacked is also disclosed, for example, in Patent Literature 2.

CITATION LIST

Patent Literature

[Patent Literature 1] Japanese Unexamined Patent Publication No. 2007-155562
[Patent Literature 2] Japanese Unexamined Patent Publication No. 2012-9607

SUMMARY OF INVENTION

Technical Problem

In the technical field of radiation imaging devices, it is desired to increase an area of an effective pixel region. However, it is difficult to increase the area of each of radiation detectors constituting a radiation imaging device. Therefore, a structure for expanding the effective pixel region by disposing a plurality of radiation detectors on a circuit board is being studied.

Further, a radiation detector may include a first substrate that converts radiation into electric charge and a second substrate that converts electric charge into predetermined signal information. With such a configuration, an electrode structure for electrically connecting the first substrate to the second substrate is required, and further, an electrode structure for electrically connecting the second substrate to a circuit board in which a plurality of radiation detectors are disposed is required. These electrode structures need to be disposed in positions in which they do not interfere with each other.

As a result of disposing the electrode structures and the like to satisfy the above conditions, a gap is generated between a pixel of the radiation detector and a pixel of another adjacent radiation detector. Since no pixel is disposed in this gap, the gap is not an effective pixel region. That is, according to the structure in which a plurality of radiation detectors are disposed, it is possible to increase the number of pixels. However, from the viewpoint of satisfactorily expanding the effective pixel region, there is room for improvement.

An object of the present invention is to provide a radiation imaging device capable of expanding an effective pixel region.

Solution to Problem

A radiation imaging device according to an embodiment of the present invention includes a radiation detector having an electric charge generation part configured to generate an electric charge corresponding to energy of incident radiation or the number of particles and a reading part configured to output a digital value based on the electric charge, and a circuit board in which a plurality of radiation detectors are disposed two-dimensionally. The reading part includes a lead-out substrate in which a plurality of signal processing parts configured to output the digital values are disposed two-dimensionally, and an intermediate substrate disposed between the electric charge generation part and the lead-out substrate and including a first main surface configured to face the electric charge generation part and a second main surface configured to face the lead-out substrate. A plurality of first electrodes electrically connected to the electric charge generation part are disposed on the first main surface. A plurality of second electrodes electrically connected to each of the signal processing parts and the first electrodes of the lead-out substrate are disposed on the second main surface. An arrangement interval of the plurality of second electrodes is different from an arrangement interval of plurality of first electrodes.

In the radiation imaging device, the radiation detector receives radiation and generates an electric charge. This electric charge is transferred to the intermediate substrate via the first electrode. Then, the electric charge moves from the intermediate substrate to the signal processing part of the lead-out substrate via the second electrode. Here, the arrangement interval of the plurality of second electrodes is different from the arrangement interval of the plurality of first electrodes. Additionally, the arrangement of the first electrodes corresponds to the arrangement of pixels in the radiation detector. Further, the arrangement of the second electrodes corresponds to the arrangement of the signal processing parts of the lead-out substrate. That is, the arrangement of the signal processing parts of the lead-out substrate is different from the arrangement of the pixels in the radiation detector. Therefore, according to the intermediate substrate, the arrangement of the pixels in the radiation detector is not constrained by the arrangement of the signal processing parts of the lead-out substrate. As a result, since a degree of freedom in the arrangement of the pixels in the radiation detector is increased, an effective pixel region can be satisfactorily expanded.

In one embodiment, the arrangement interval of the plurality of second electrodes may be narrower than the arrangement interval of the plurality of first electrodes. With such a configuration, the second electrodes can be disposed to correspond to the arrangement of the signal processing parts included in the lead-out substrate.

In one embodiment, a plurality of intermediate substrates may be disposed between the electric charge generation part and the lead-out substrate. With such a configuration, a length of a wiring that electrically connects the first electrode to the second electrode can be made uniform.

In one embodiment, the lead-out substrate may include an input part including third electrodes electrically connected to the second electrodes of the intermediate substrate and in which the intermediate substrate is disposed, and an output part including fourth electrodes electrically connected to the circuit board and provided adjacent to the input part. With such a configuration, the lead-out substrate can suitably receive an electric charge from the intermediate substrate and can output the digital value to the circuit board.

In one embodiment, an exterior of the intermediate substrate in a plan view may be smaller than an exterior of the electric charge generation part in a plan view. Further, an exterior of the lead-out substrate in a plan view may be smaller than an exterior of the electric charge generation part in a plan view.

In one embodiment, an exterior of the intermediate substrate in a plan view may be larger than an exterior of the electric charge generation part in a plan view. Further, an exterior of the lead-out substrate in a plan view may be larger than an exterior of the electric charge generation part in a plan view.

In one embodiment, the first electrodes may be disposed according to a first arrangement interval and a second arrangement interval different from the first arrangement interval. Further, the second electrodes may be disposed according to a third arrangement interval and a fourth arrangement interval different from the third arrangement interval.

Advantageous Effects of Invention

According to the present invention, a radiation imaging device capable of expanding an effective pixel region is provided.

DESCRIPTION OF EMBODIMENTS

Figure 1:
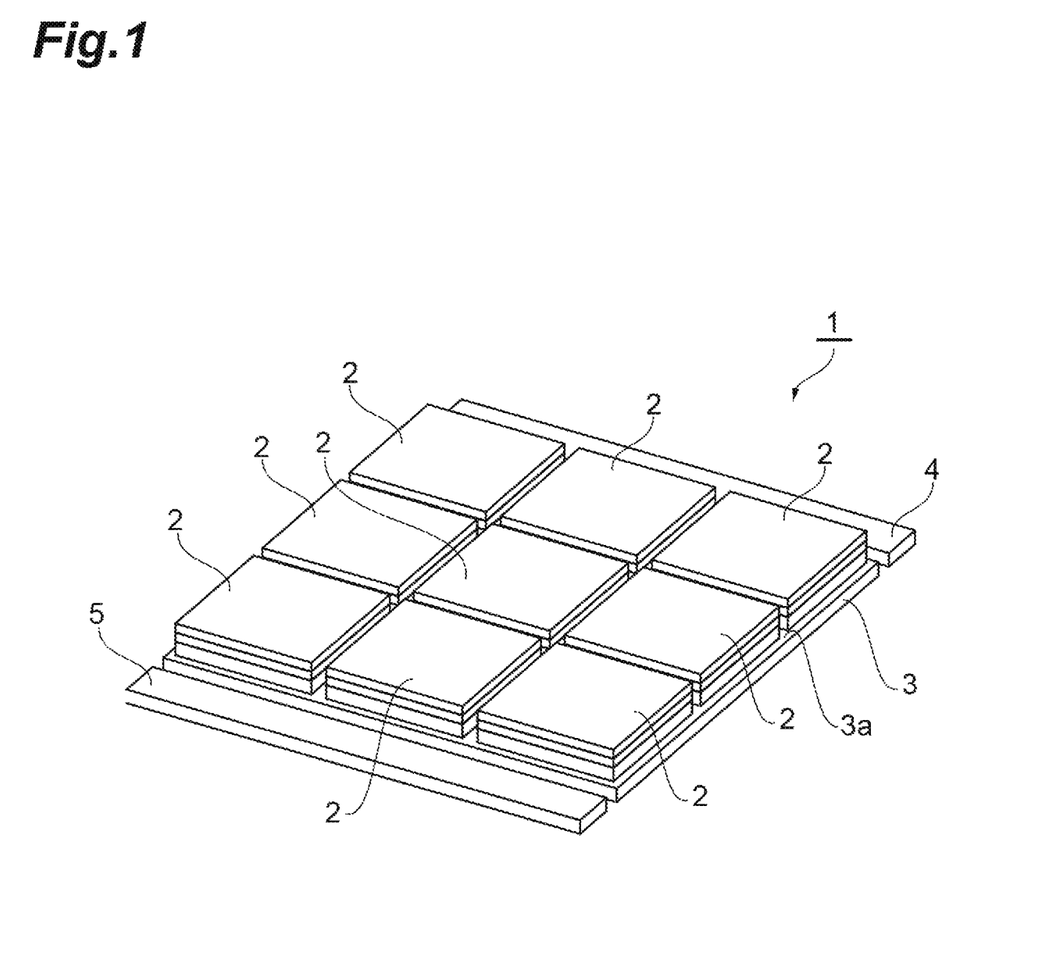
FIG. 1 is a perspective view showing a configuration of a radiation imaging device according to an embodiment.

A radiation imaging device 1 shown in FIG. 1 obtains a two-dimensional image based on radiation arriving from an inspection target. The radiation is, for example, gamma rays, X-rays, alpha rays, beta rays, and the like. The radiation imaging device 1 includes a plurality of radiation detectors 2 and a circuit board 3. The radiation detectors 2 are mounted on a circuit main surface 3a of the circuit board 3. Each of the radiation detectors 2 outputs a pixel signal corresponding to incident radiation. The radiation detector 2 includes a plurality of pixel structures G (refer to FIG. 4) and outputs a pixel signal for each of the pixel structures G. The pixel signal is used to generate a radiation image in an image generation part 4. The circuit board 3 receives the pixel signal output from the radiation detector 2. The circuit board 3 has a signal line for providing a control signal from a control part 5 to the radiation detector 2. Further, the circuit board 3 has a signal line for outputting a pixel signal to the image generation part 4. Further, the circuit board 3 may have a signal line for electrically connecting the radiation detectors 2 to each other.

Figure 2:
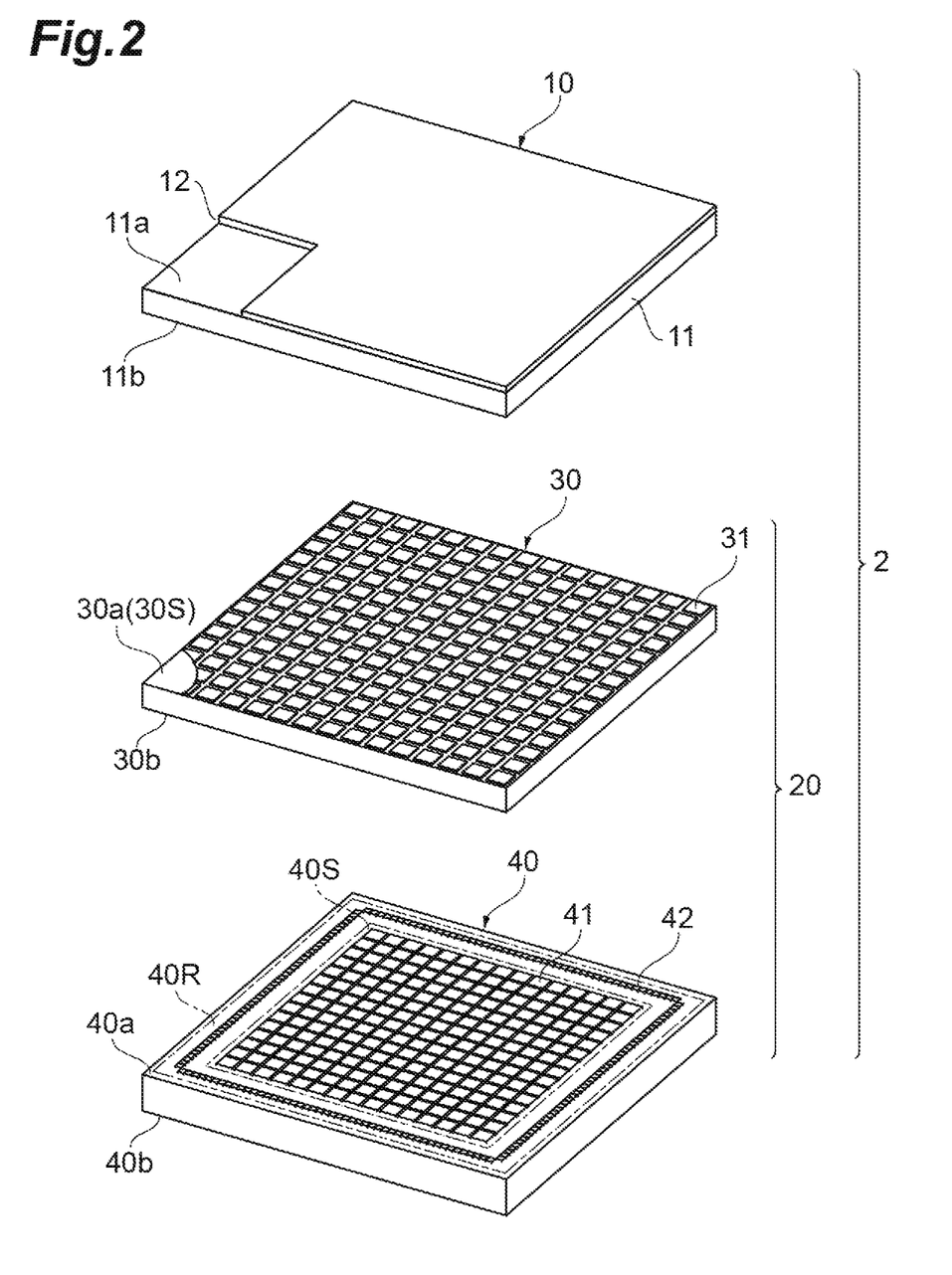
FIG. 2 is a perspective view of the radiation imaging device shown in FIG. 1 when seen from a first viewpoint in a state in which the radiation imaging device is disassembled.
Figure 3:
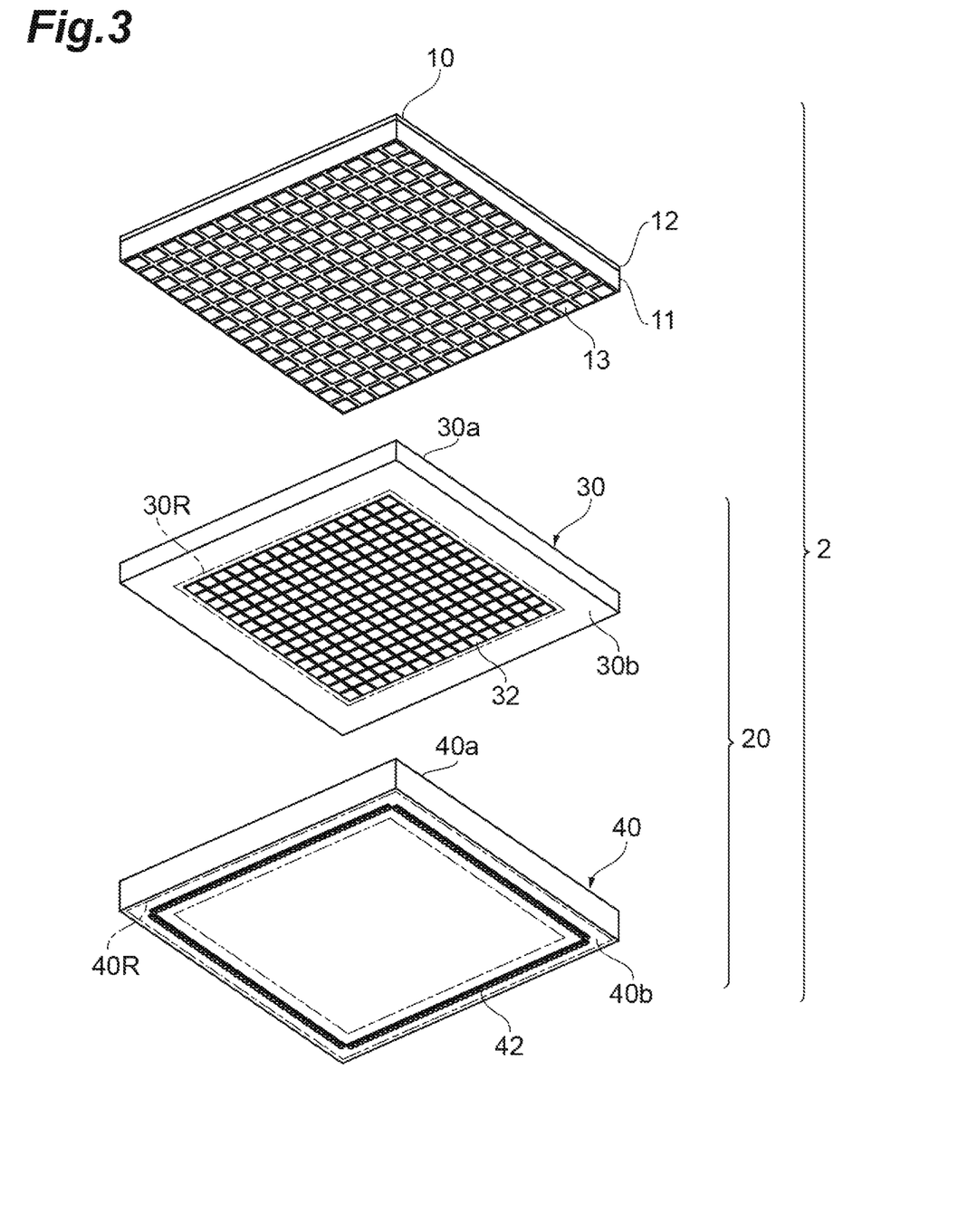
FIG. 3 is a perspective view of the radiation imaging device shown in FIG. 1 when seen from a second viewpoint in the state in which the radiation imaging device is disassembled.

As shown in FIGS. 2 and 3, the radiation detector 2 includes an electric charge generation part 10 and a reading part 20. Shapes of the electric charge generation part 10 and the reading part 20 are plate-shaped. The radiation detector 2 has a stacked structure. The electric charge generation part 10 is disposed on the reading part 20. The electric charge generation part 10 is electrically connected to the reading part 20. The electric charge generation part 10 generates an electric charge according to the incident radiation. The electric charge generation part 10 outputs the electric charge to the reading part 20. The reading part 20 generates a pixel signal using the electric charge generated by the electric charge generation part 10.

The electric charge generation part 10 includes a semiconductor detection part 11, a control electrode part 12, and an electric charge output electrode 13.

The semiconductor detection part 11 generates electron-hole pairs (electric charge pairs) due to the received X-rays. That is, the semiconductor detection part 11 converts the received radiation into a current signal (an electric charge signal) corresponding to energy thereof. A planar shape of the semiconductor detection part 11 is rectangular. A size of the semiconductor detection part 11 is, for example, about 9.6 mm×9.6 mm. The semiconductor detection part 11 has a semiconductor incident surface 11a that receives radiation such as X-rays, and a semiconductor output surface 11b that outputs an electric charge. A signal based on the electric charge is provided from the semiconductor output surface 11b to the reading part 20. As the semiconductor detection part 11, for example, a Cd(Zn)Te electric charge generator, a Si electric charge generator, a Ge electric charge generator, a GaAs electric charge generator, a GaN electric charge generator, a TlBr electric charge generator, or the like may be used. Further, a device including a scintillator and a photodetector may be used as the semiconductor detection part 11. The scintillator converts X-rays into light. The photodetector converts the light generated by the scintillator into an electric charge.

The control electrode part 12 is provided on the semiconductor incident surface 11a. The control electrode part 12 covers the entire surface of the semiconductor incident surface 11a. In a plan view, a planar shape of the control electrode part 12 coincides with the planar shape of the semiconductor incident surface 11a. The control electrode part 12 forms an electric field in a region in which the semiconductor detection part 11 is disposed. The electric field determines a direction in which the electric charge generated in the semiconductor detection part 11 moves. The control electrode part 12 generates the electric field inside the semiconductor detection part 11 so that the electric charge moves toward the semiconductor output surface 11b.

A plurality of electric charge output electrodes 13 are provided on the semiconductor output surface 11b. Each of the electric charge output electrodes 13 may be a bump. One electric charge output electrode 13 corresponds to one pixel. Therefore, a region in which the electric charge output electrodes 13 are disposed is a pixel region. For example, when n electric charge output electrodes 13 are disposed on a first side and m electric charge output electrodes 13 are disposed on a second side, the total number of electric charge output electrodes 13 is k (k=n×m). In this case, it can be said that the number of pixels of one radiation detector 2 is k. Additionally, when the radiation imaging device 1 has p radiation detectors 2, it can be said that the number of pixels of the radiation imaging device 1 is r (r=k×p).

The number of pixels of one radiation detector 2 is, for example, 96. Therefore, the number of electric charge output electrodes 13 is also 96. As described above, assuming that the size of the semiconductor detection part 11 is a square of about 9.6 mm×9.6 mm, a distance between the electric charge output electrodes 13 is 100 μm. In FIG. 2 and the like, for convenience of illustration, the number of electric charge output electrodes 13 is shown as a number less than 96.

The reading part 20 generates a pixel signal based on the electric charge generated by the semiconductor detection part 11. The pixel signal is a digital value. The reading part 20 outputs the pixel signal to the circuit board 3. The reading part 20 includes an intermediate substrate 30 and a lead-out substrate 40.

An intermediate substrate 30 guides the electric charge generated by the semiconductor detection part 11 to a lead-out substrate 40. Although the details will be described later, the arrangement of the electric charge output electrode 13 is different from the arrangement of a first lead-out electrode 41. Therefore, the intermediate substrate 30 functions to connect the electrodes disposed at different positions from each other. This function is called pitch conversion. Therefore, the intermediate substrate 30 is a pitch conversion substrate. The intermediate substrate 30 converts a pitch of the electric charge output electrode 13 of the semiconductor detection part 11 into a pitch of the first lead-out electrode 41 of the lead-out substrate 40.

The intermediate substrate 30 has an intermediate input surface 30a (a first main surface) and an intermediate output surface 30b (a second main surface). The intermediate input surface 30a faces the electric charge generation part 10. The intermediate output surface 30b faces the lead-out substrate 40.

The intermediate input surface 30a faces the semiconductor output surface 11b of the semiconductor detection part 11. A rectangular intermediate input region 30S is set on the intermediate input surface 30a in a plan view. The intermediate input region 30S is set over almost the entire surface of the intermediate input surface 30a. For example, the intermediate input region 30S may be the entire surface of the intermediate input surface 30a. In the intermediate input region 30S, a plurality of first intermediate electrodes 31 (first electrodes) are disposed two-dimensionally at equal intervals. The electric charge output electrode 13 of the semiconductor detection part 11 is electrically connected to the first intermediate electrode 31. Therefore, a pitch (an interval) of the first intermediate electrodes 31 adjacent to each other is the same as a pitch of the electric charge output electrodes 13. For example, when the pitch of the electric charge output electrodes 13 is 100 μm, the pitch of the first intermediate electrodes 31 is also 100 μm. On the intermediate input surface 30a, the intermediate input region 30S corresponds to the pixel region.

A rectangular intermediate output region 30R is set on the intermediate output surface 30b in a plan view. In a plan view, the entire intermediate output region 30R overlaps the intermediate input region 30S. That is, an area of the intermediate output region 30R is smaller than an area of the intermediate input region 30S. A plurality of second intermediate electrodes 32 (second electrodes) are disposed two-dimensionally in the intermediate output region 30R.

The first intermediate electrodes 31 (refer to FIG. 2) are disposed in the vicinity of a side surface of the intermediate substrate 30. On the other hand, the second intermediate electrodes 32 (refer to FIG. 3) are not disposed in the vicinity of the side surface of the intermediate substrate 30. The second intermediate electrode 32 disposed on the outermost circumference is separated from the side surface of the intermediate substrate 30. A distance from the second intermediate electrode 32 to the side surface of the intermediate substrate 30 is larger than a distance from the first intermediate electrode 31 to the side surface of the intermediate substrate 30. For example, the distance from the second intermediate electrode 32 to the side surface of the intermediate substrate 30 is larger than a length of several second intermediate electrodes 32. This distance corresponds to a width of a lead-out output part 40R which will be described later. Assuming that the width of the lead-out output part 40R is 200 μm, the distance from the second intermediate electrode 32 to the side surface of the intermediate substrate 30 is also approximately 200 μm.

Figure 4:
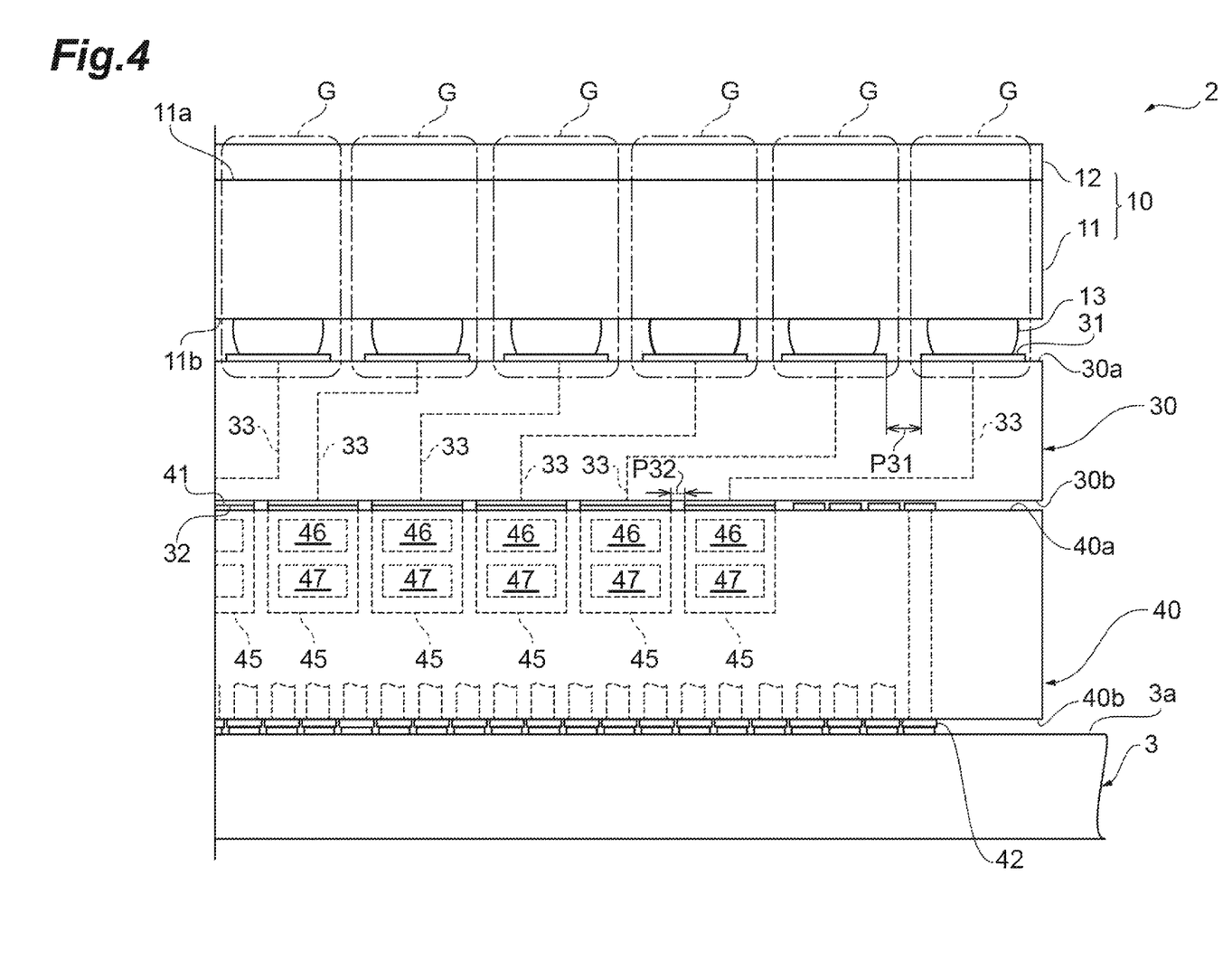
FIG. 4 is an enlarged view showing a radiation detector included in the radiation imaging device of FIG. 1.

As shown in FIG. 4, one first intermediate electrode 31 is electrically connected to one second intermediate electrode 32. Therefore, the intermediate substrate 30 has a wiring 33 that connects the first intermediate electrode 31 to the second intermediate electrode 32. A configuration of the wiring is not particularly limited. For example, the wiring may be a combination of a wiring part (a vertical via) that extends in a thickness direction of the intermediate substrate 30 and a wiring part (a diagonal wiring layer) that extends in a direction of a surface of the intermediate substrate 30. Further, the wiring may have a configuration (a diagonal via) that extends linearly from the first intermediate electrode 31 to the second intermediate electrode 32. The diagonal via extends in a diagonal direction. According to the diagonal via, a pitch conversion distance that is a wiring distance from the first intermediate electrode 31 to the second intermediate electrode 32 can be shortened. As a result, the influence of stray capacitance can be reduced.

The number of the first intermediate electrodes 31 is the same as the number of the second intermediate electrodes 32. A pitch P32 of the second intermediate electrodes 32 adjacent to each other is smaller than a pitch P31 of the first intermediate electrodes 31 adjacent to each other. Assuming that the pitch P31 of the first intermediate electrode 31 is 100 μm, 80 μm can be exemplified as the pitch P32 of the second intermediate electrode 32. In the present embodiment, the plurality of second intermediate electrodes 32 are disposed at equal intervals, but the pitch P32 of the second intermediate electrodes 32 is not limited to equal intervals. Some examples of arrangement of the second intermediate electrode 32 are exemplified in a column of a modified example.

Referring to FIGS. 2 and 3 again, the lead-out substrate 40 receives an electric charge and generates a pixel signal corresponding to the received electric charge. The lead-out substrate 40 has a lead-out input surface 40a and a lead-out output surface 40b. The lead-out input surface 40a faces the intermediate output surface 30b. The lead-out output surface 40b faces the circuit board 3. Further, the lead-out substrate 40 includes a lead-out input part 40S (an input part), a lead-out output part 40R (an output part), and a plurality of signal processing parts 45.

The lead-out input part 40S is formed on the lead-out input surface 40a. The lead-out input part 40S includes a plurality of first lead-out electrodes 41 (third electrodes). The arrangement of the first lead-out electrodes 41 corresponds to the arrangement of the second intermediate electrodes 32. That is, the first lead-out electrodes 41 face the second intermediate electrodes 32. As a result, one first lead-out electrode 41 is electrically connected to one second intermediate electrode 32. Then, the first lead-out electrode 41 receives an electric charge from the second intermediate electrode 32.

The lead-out output part 40R functions as a signal input and output part between the radiation detector 2 and another component (the control part 5 and the image generation part 4). For example, the lead-out output part 40R receives a control signal for operating the radiation detector 2 from the control part 5. Further, the lead-out output part 40R outputs a digital value to the image generation part 4. The lead-out output part 40R is formed to surround the lead-out input part 40S. For example, a width of the lead-out output part 40R is 200 μm. In a plan view, the lead-out output part 40R has a frame shape.

The lead-out output part 40R includes a plurality of second lead-out electrodes 42 (fourth electrodes). For example, in the frame-shaped lead-out output part 40R, 50 second lead-out electrodes 42 are disposed on one side. Therefore, 200 second lead-out electrodes 42 are disposed on the four sides constituting the lead-out output part 40R. One second lead-out electrode 42 is connected to one signal processing part 45. The second lead-out electrode 42 surrounds the lead-out input part 40S. In other words, the plurality of second lead-out electrodes 42 are disposed on the lead-out input surface 40a to surround the plurality of first lead-out electrodes 41. Each of the second lead-out electrode 42 is a through electrode. That is, the second lead-out electrode 42 reaches from the lead-out input surface 40a to the lead-out output surface 40b. Each of the second lead-out electrodes 42 is electrically connected to the circuit board 3 via a bump provided on the lead-out output surface 40b.

The signal processing part 45 converts an electric charge into a pixel signal which is the digital value. One signal processing part 45 is connected to one first lead-out electrode 41. The signal processing part 45 receives an electric charge from the lead-out input part 40S. The signal processing part 45 outputs a digital value from the lead-out output part 40R. More specifically, the signal processing part 45 converts the electric charge output by the electric charge generation part 10 into an energy integration signal which is the pixel signal. The energy integration signal includes at least information on energy possessed by the incident radiation.

Figure 5:
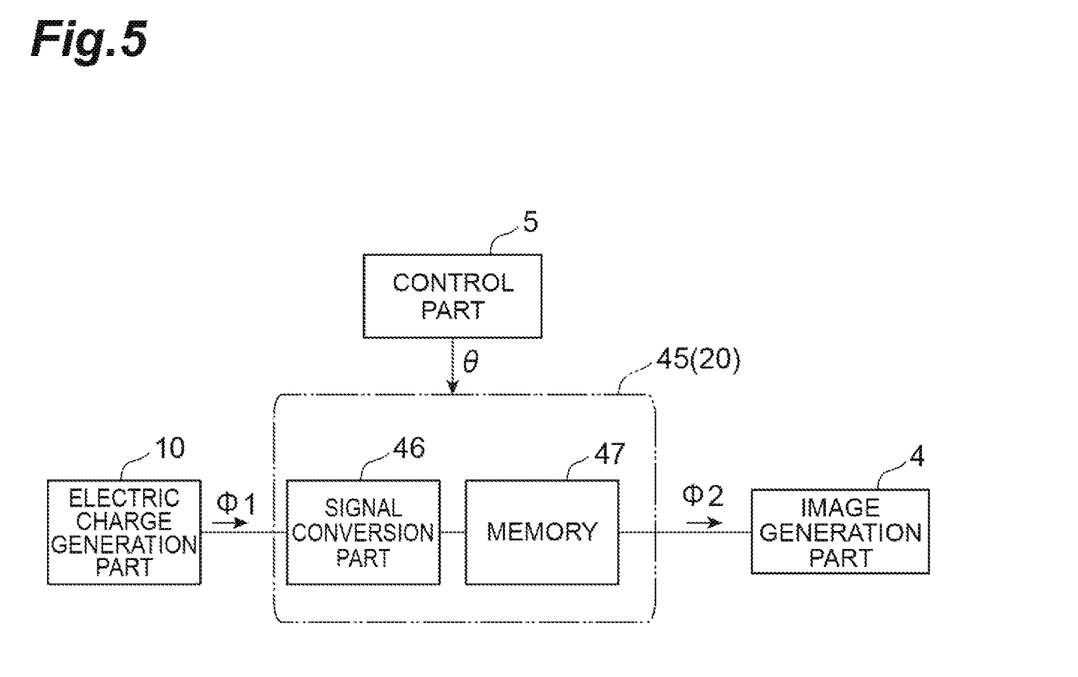
FIG. 5 is a block diagram showing a configuration of a signal processing part included in the radiation imaging device shown in FIG. 4.

As shown in FIG. 5, the reading part 20 includes a signal conversion part 46 and a memory 47. The signal conversion part 46 and the memory 47 constitute the signal processing part 45. That is, one signal conversion part 46 and one memory 47 are connected to one pixel of the electric charge generation part 10.

One signal conversion part 46 is connected to one electric charge output electrode 13 of the electric charge generation part 10 via the wiring 33 of the intermediate substrate 30. The signal conversion part 46 receives an electric charge $\varphi 1$ from the electric charge generation part 10. The signal conversion part 46 discretizes an analog signal based on the electric charge $\varphi 1$. The analog signal is expressed as a voltage. The voltage corresponds to the energy of radiation or the number of particles incident on the corresponding pixel of the electric charge generation part 10. Therefore, the signal conversion part 46 is an A/D converter that outputs a digital signal. For example, a resolution of the signal conversion part 46 may be 10 bits.

The memory 47 is connected to the signal conversion part 46. The memory 47 receives a digital signal $\varphi 2$ from the signal conversion part 46. Then, the memory 47 stores the digital signal $\varphi 2$ each time when the digital signal $\varphi 2$ is input. The memory 47 sequentially stores the digital signal $\varphi 2$ in a predetermined memory space. Then, the memory 47 outputs the digital signal $\varphi 2$ to the image generation part 4 according to a control signal $\theta$ provided by the control part 5.

Examples of the radiation detector include a scintillation detector and a semiconductor detection part. When the scintillation detector and the semiconductor detection part are compared, the semiconductor detection part can easily realize high sensitivity and high resolution in an X-ray imaging technology. The radiation imaging device 1 equipped with the semiconductor detection part can take a finer X-ray image in a shorter time. As a result, the radiation imaging device 1 equipped with the semiconductor detection part is used in the medical, industrial, non-destructive inspection, security, industrial and social infrastructure inspection, and the like.

However, it is difficult for the semiconductor detection part to realize a large detection area with a single element. A detection area in a single semiconductor detection part is, for example, about 20 mm×20 mm. In the field in which the above-described radiation imaging device 1 is used, a detection area of, for example, 400 mm×400 mm is required. Therefore, a method in which a large detection area that cannot be realized by a single semiconductor detection part is realized by a plurality of semiconductor detection parts is being studied.

A signal output by the semiconductor detection part due to the incidence of radiation cannot be read by the semiconductor detection part alone. That is, the radiation imaging device 1 includes, in addition to the semiconductor detection part, a reading circuit that processes a signal output by the semiconductor detection part. The semiconductor detection part and the reading circuit are stacked. A module including the semiconductor detection part and the reading circuit in this way is called a detector module. Then, a signal output for each of pixels of the semiconductor detection part is converted into a digital value by signal processing in the reading circuit.

A radiation image is generated by further signal processing using the digital value. Therefore, it is necessary to transmit the digital value from the reading circuit to a processing device that performs processing such as generating a radiation image. That is, it is necessary to electrically connect the processing device to the reading circuit.

As such a connection configuration, a configuration in which the circuit board and the reading circuit are connected by a bonding wire can be exemplified. However, in the connection configuration using the bonding wire, it is necessary to dispose a bonding pad on the circuit board. As a result, a large gap is created between the semiconductor detection parts adjacent to each other. The gap between the semiconductor detection parts does not function as a radiation detection region. As a result, it is disadvantageous as an imaging apparatus.

As another connection configuration, a configuration in which a part of one detector module overlaps a part of another detector module adjacent to each other is also being considered. According to such an arrangement, each of the detector modules is disposed diagonally in a height direction. That is, a gap between the detector modules is prevented from being generated by disposing a reading electrode under the adjacent detector module. However, with such an arrangement, an incident surface of the detector module is tilted with respect to a radiation source. As a result, a distance from the radiation source to the detector module varies according to the pixels. Moreover, it is difficult to mount the detector module diagonally in the first place.

Therefore, the inventors have come up with a technique in which a plurality of detector modules are disposed on a circuit board without mounting the detector modules diagonally. As a result, it is possible to provide a radiation imaging device that can realize a large detection area and can minimize a gap between detectors.

In the radiation imaging device 1 of the present embodiment, the radiation detector 2 receives radiation and generates an electric charge. The electric charge is transferred to the intermediate substrate 30 via the first intermediate electrode 31. Then, the electric charge is transferred from the intermediate substrate 30 to the signal processing part 45 of the lead-out substrate 40 via the second intermediate electrode 32. Here, an arrangement interval of the plurality of second intermediate electrodes 32 is different from an arrangement interval of the plurality of first intermediate electrodes 31. Specifically, the arrangement interval of the plurality of second intermediate electrodes 32 is smaller than the arrangement interval of the plurality of first intermediate electrodes 31.

The arrangement of the first intermediate electrodes 31 corresponds to the arrangement of the pixels in the radiation detector 2. Further, the arrangement of the second intermediate electrodes 32 corresponds to the arrangement of the signal processing parts 45 of the lead-out substrate 40. That is, the arrangement of the signal processing parts 45 of the lead-out substrate 40 is different from the arrangement of the pixels in the radiation detector 2. Therefore, according to the intermediate substrate 30, the arrangement of the pixels in the radiation detector 2 is not constrained by the arrangement of the signal processing part 45 of the lead-out substrate 40. As a result, since the degree of freedom in disposing the pixels in the radiation detector 2 is increased, the effective pixel region between the plurality of radiation detectors 2 can be satisfactorily expanded.

Figure 6:
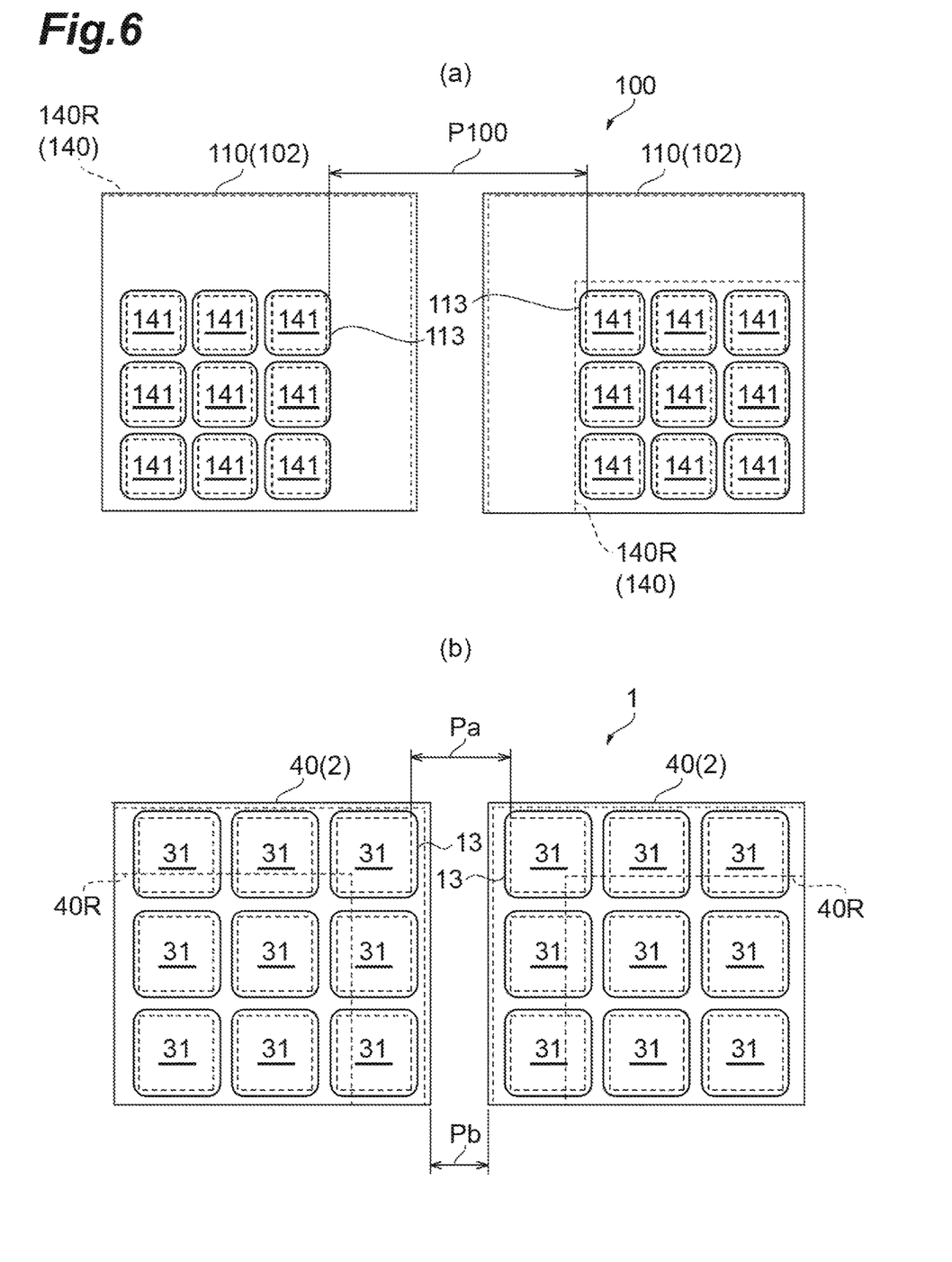
FIG. 6(a) is a diagram for describing an effective pixel region in the radiation imaging device of a comparative example.
FIG. 6(b) is a diagram for describing an effective pixel region in the radiation imaging device of the embodiment.

It will be described in more detail with reference to a specific example. FIG. 6(a) shows two radiation detectors 102 included in the radiation imaging device 100 of a comparative example in which electrodes 113 of an electric charge generation part 110 and electrodes 141 of the lead-out substrate 140 overlap each other. The electrodes 113 are directly connected to the electrodes 141 of the lead-out substrate 140. The radiation detector 102 includes an electric charge generation part 110 and a lead-out substrate 140. That is, the radiation detector 102 does not include an intermediate substrate. Therefore, the electrodes 141 of the lead-out substrate 140 are directly connected to the electrodes 113 of the electric charge generation part 110. As a result, the electrodes 113 of the electric charge generation part 110 need to coincide with the arrangement of the electrodes 141 of the lead-out substrate 140.

The lead-out substrate 140 includes a lead-out output part 140R in which a plurality of input and output electrodes are disposed. The electrodes 141 connected to the electric charge generation part 110 cannot be disposed in a region in which they overlap the lead-out output part 140R. That is, the electrodes 141 of the lead-out substrate 140 are disposed in a region surrounded by the lead-out output part 140R. As described above, the arrangement of the electrodes 141 of the lead-out substrate 140 coincides with the arrangement of the electrodes 113 of the electric charge generation part 110. Therefore, in a plan view, the electrodes 113 of the electric charge generation part 110 are also disposed in the region surrounded by the lead-out output part 140R. As a result, a gap is formed between the electrode 113 of the electric charge generation part 110 and the electrode 113 of the adjacent electric charge generation part 110. The arrangement of the electrodes 113 of the electric charge generation part 110 corresponds to the arrangement of pixels. Therefore, an interval P100 is formed between the pixel formed by the radiation detector 102 and the pixel of the adjacent radiation detector 102. Since there is no pixel at this interval P100, radiation cannot be detected. As a result, although the number of pixels increases, it cannot be said that the effective pixel region can be expanded satisfactorily.

FIG. 6(b) shows the first intermediate electrodes 31 in the two radiation detectors 2 included in the radiation imaging device 1 of the embodiment. The radiation imaging device 1 of the embodiment includes the intermediate substrate 30. According to the intermediate substrate 30, the arrangement of the electric charge output electrodes 13 of the electric charge generation part 10 may coincide with the arrangement of the first intermediate electrode 31 of the intermediate substrate 30 and does not need to coincide with the arrangement of the first lead-out electrodes 41. Therefore, the electric charge output electrodes 13 of the electric charge generation part 10 can be disposed close to the side surface of the substrate of the electric charge generation part 10. With such an arrangement, an interval Pa between the electric charge output electrode 13 of the radiation detector 2 and the electric charge output electrode 13 of the adjacent radiation detector 2 is shortened. That is, since a region that is not the effective pixel region is reduced, a wide effective pixel region can be secured. As a result, the number of pixels can be increased, and the effective pixel region can be satisfactorily expanded.

The effective pixel region is an area of the semiconductor detection part 11. Therefore, the intermediate substrate 30 and the lead-out substrate 40 disposed below the semiconductor detection part 11 may be larger than the semiconductor detection part 11 as long as the structure is not impaired. In other words, the reading part 20 which is an LSI configured of the intermediate substrate 30 and the lead-out substrate 40 may be larger than the electric charge generation part 10. On the contrary, the intermediate substrate 30 and the lead-out substrate 40 may be smaller than the semiconductor detection part 11. That is, a size of the intermediate substrate 30 and the lead-out substrate 40 does not necessarily have to coincide with a size of the semiconductor detection part 11.

For example, a difference in the size between the intermediate substrate 30 and the semiconductor detection part 11 may be maximally about ½ of a pitch of a pixel structure G. This can be adopted even when the intermediate substrate 30 is larger than the semiconductor detection part 11 and can also be adopted when the intermediate substrate 30 is smaller than the semiconductor detection part 11. Further, the same configuration may be adopted for the difference in the size between the lead-out substrate 40 and the semiconductor detection part 11. The difference in the size between the lead-out substrate 40 and the semiconductor detection part 11 may be maximally about ½ of the pitch of the pixel structure G.

When the radiation detector 2 is disposed on the circuit board 3, a distance from the side surface of the semiconductor detection part 11 (the radiation detector 2) to the side surface of another semiconductor detection part 11 (the radiation detector 2) adjacent to the semiconductor detection part 11 is not completely zero. This distance is referred to as an interval Pb. As shown in FIG. 6(b), the interval Pb is present inside the interval Pa. Therefore, an external size of the semiconductor detection part 11 is reduced so that a pixel pitch of the first lead-out electrode 41 at the outermost edge portion of the adjacent lead-out output part 40R becomes equal to a pixel pitch (for example, 100 μm described above) within the arrangement of the single lead-out output part 40R. With such a configuration, it is possible to perform mounting in which the pixel pitch is maintained even across the plurality of semiconductor detection parts 11 by reducing a sensitive area of the outermost edge portion.

When the interval Pb has to be large to have an influence when compared with the pixel pitch of the lead-out output part 40R even with this technique, a margin corresponding to the pixel pitch is added to the interval Pb. In this case, the pitch between the edge portions of the adjacent lead-out output parts 40R is a pixel pitch×N (N is an integer larger than 1). As a result, it is possible to perform mounting in which the pixel pitch is maintained between the lead-out output parts 40R.

An operation and an effect of the radiation imaging device 1 of the present embodiment will be described from another viewpoint. The radiation imaging device 1 of the embodiment adopts a circuit structure in which the second lead-out electrode 42 which is a reading electrode does not protrude from a footprint of the semiconductor detection part 11. That is, the second lead-out electrode 42 has a shape that extends in a direction perpendicular to the main surface of the circuit board 3. Further, the radiation imaging device 1 of the embodiment adopts a multi-layer structure on the substrate on which the module is tiled. That is, a signal output by the module disposed inside the substrate is output to the outside via the wiring provided on an inner layer and a back surface.

The radiation imaging device 1 has the same detection area as that of an exterior of the module. In other words, in the radiation imaging device 1, the electrodes do not protrude in the horizontal direction. As a result, when the plurality of radiation detectors 2 are disposed on the circuit board 3, it is not necessary to provide a gap for disposing the electrodes. Further, due to the arrangement in which the gap is reduced, the radiation imaging device 1 does not need to mount the radiation detector 2 diagonally. That is, the plurality of radiation detectors 2 can be mounted horizontally on the circuit board 3.

An arrangement interval of the plurality of second intermediate electrodes 32 is narrower than an arrangement interval of the plurality of first intermediate electrodes 31. With such a configuration, the second intermediate electrodes 32 can be disposed to correspond to the arrangement of the signal processing part 45 included in the lead-out substrate 40.

the lead-out substrate 40 includes the lead-out input part 40S including the first lead-out electrode 41 electrically connected to the second intermediate electrode 32 of the intermediate substrate 30 and in which the intermediate substrate 30 is disposed, and the lead-out output part 40R including the second lead-out electrode 42 electrically connected to the circuit board 3 and provided to surround the lead-out input part 40S. With such a configuration, the lead-out substrate 40 can receive preferably an electric charge from the intermediate substrate 30 and can output a digital value to the circuit board 3.

The radiation imaging device 1 of the present invention is not limited to the above-described embodiment. For example, various modified examples can be adopted for the configuration of the intermediate substrate 30. In the above-described embodiment, the arrangement of the second intermediate electrodes 32 included in the intermediate substrate 30 is uniform. In other words, the pitches of the second intermediate electrodes 32 are all the same. However, the pitches of the second intermediate electrodes 32 do not all have to be the same.

Figure 7:
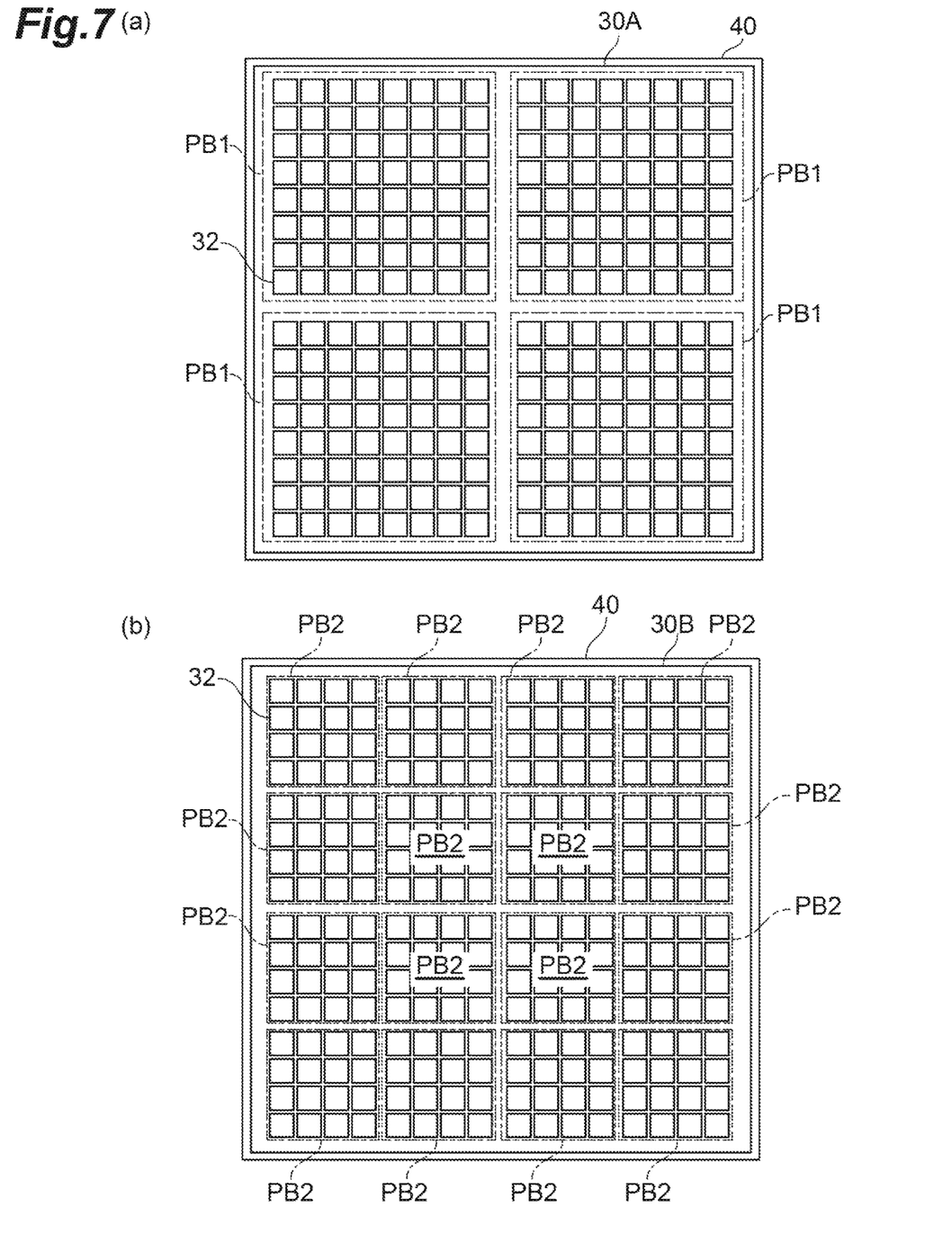
FIG. 7(a) is a diagram showing a pixel block included in the radiation imaging device of a first modified example.
FIG. 7(b) is a diagram showing a pixel block included in the radiation imaging device of a second modified example.

For example, as shown in FIG. 7(a), an intermediate substrate 30A may have four pixel blocks PB1. A plurality of second intermediate electrodes 32 are uniformly disposed on a pixel block PB1. An interval between the pixel blocks PB1 adjacent to each other is wider than an interval between the second intermediate electrodes 32 included in the pixel block PB1. With such an arrangement, it is possible to reduce a difference in a length of the wiring which connects the first intermediate electrode 31 to the second intermediate electrode 32. More specifically, when the second intermediate electrodes 32 are uniformly disposed on the entire surface of the intermediate output surface 3b, a positional deviation between the first intermediate electrode 31 and the second intermediate electrode 32 disposed in the vicinity of the center of the substrate is small That is, the length of the wiring (a pitch conversion distance) is short. On the other hand, the positional deviation between the first intermediate electrode 31 and the second intermediate electrode 32 disposed around the substrate is large. That is, the length of the wiring is long. The length of the wiring may affect the signal passing through the wiring. For example, a configuration of the wiring can be a factor which generates stray capacitance. That is, it is desired to take measures against noise by considering a difference in the stray capacitance for each connection configuration between the first intermediate electrode 31 and the second intermediate electrode 32. Therefore, preferably, a difference between a maximum value and a minimum value of the length of the wiring in the intermediate substrate 30 is small.

According to the arrangement of the second intermediate electrode 32 shown in FIG. 7(a), the difference between the maximum value and the minimum value of the length of the wiring in the intermediate substrate 30 can be reduced. Therefore, the difference in the influence on the signal is also small, and thus a good radiation image can be obtained.

When the arrangement of the second intermediate electrodes 32 shown in FIG. 7(a) is adopted, the arrangement of the first lead-out electrodes 41 also coincides with the arrangement of the second intermediate electrodes 32 shown in FIG. 7(a). In this case, a region in which the first lead-out electrodes 41 are not provided is formed in the lead-out substrate 40. An electrode having a desired function, a control circuit, or the like may be additionally formed in this region. On the other hand, the arrangement of the electric charge output electrodes 13 of the electric charge generation part 10 is not constrained by the arrangement of the second intermediate electrodes 32 shown in FIG. 7(a), that is, the same arrangement as in the embodiment can be adopted. The arrangement of the second intermediate electrodes 32 shown in FIG. 7(a) is not limited to the case in which it is realized by one intermediate substrate 30A. It may be realized by a plurality of intermediate substrates.

FIG. 7(b) is an example of another arrangement of the second intermediate electrodes 32 included in the intermediate substrate 30B. As shown in FIG. 7(a), the number of pixel blocks PB1 is not limited to one as in the embodiment and four as in the first modified example. As shown in FIG. 7(b), 16 pixel blocks PB2 may be formed in the intermediate substrate 30B. Further, the arrangement of the second intermediate electrodes 32 shown in FIG. 8 may be realized by a plurality of intermediate substrates.

Figure 8:
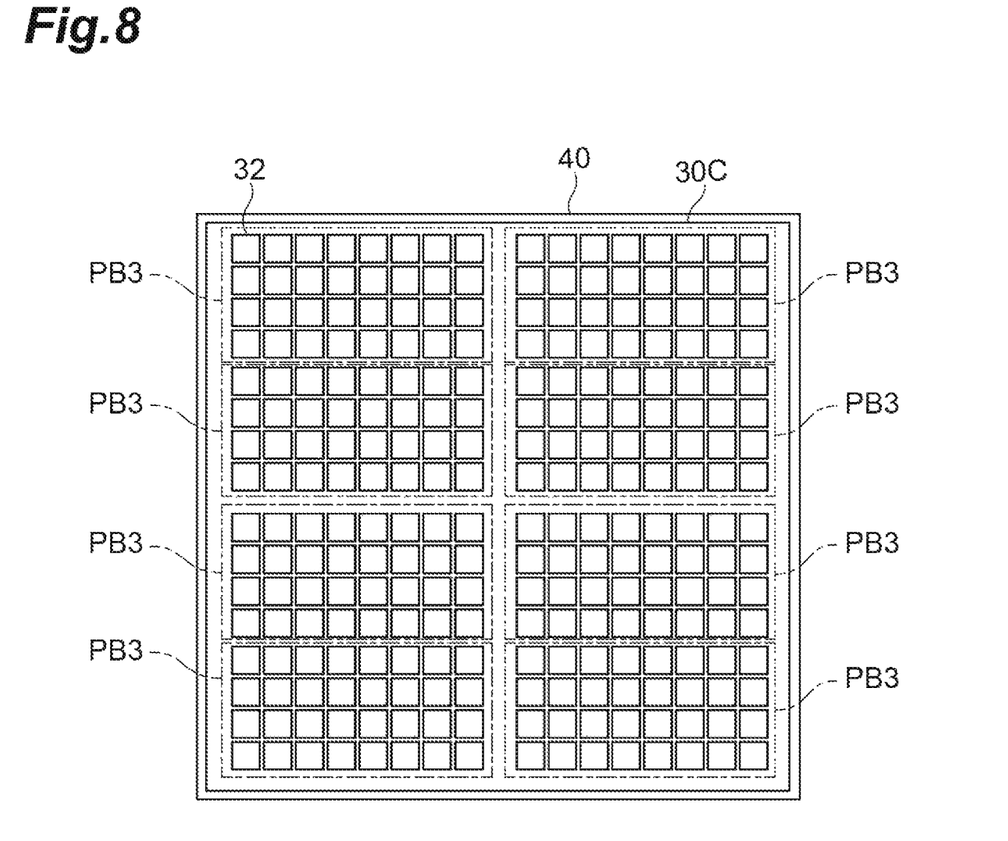
FIG. 8 is a diagram showing a pixel block included in the radiation imaging device of a third modified example.

FIG. 8 is an example of still another arrangement of the second intermediate electrodes 32 included in the intermediate substrate 30C. As shown in FIG. 8, a shape of a pixel block PB3 is not limited to a square. In other words, in the arrangement of the second intermediate electrodes 32 disposed in the pixel block PB3, the number of the second intermediate electrodes 32 disposed vertically and the number of the second intermediate electrodes 32 disposed horizontally do not have to coincide with each other. In other words, the number of the second intermediate electrodes 32 disposed vertically may be different from the number of the second intermediate electrodes 32 disposed horizontally. As shown in FIG. 8, the number of the second intermediate electrodes 32 disposed vertically may be four, and the number of the second intermediate electrodes 32 disposed horizontally may be eight. Further, as exemplified in a third modified example, the arrangement of the second intermediate electrodes 32 shown in FIG. 8 may be realized by one intermediate substrate 30 or may be realized by a plurality of intermediate substrates 30.

REFERENCE SIGNS LIST

1 Radiation imaging device
2 Radiation detector
3 Circuit board
4 Image generation part
5 Control part
10 Electric charge generation part
20 Reading part
11 Semiconductor detection part
12 Control electrode part
13 Electric charge output electrode
11a Semiconductor incident surface
11b Semiconductor output surface
30 Intermediate substrate
40 Lead-out substrate
30a Intermediate input surface (first main surface)
30b Intermediate output surface (second main surface)
30S Intermediate input region
31 First intermediate electrode (first electrode)
30R Intermediate output region
32 Second intermediate electrode (second electrode)
40a Lead-out input surface
40b Lead-out output surface
45 Signal processing part
41 First lead-out electrode (third electrode)
42 Second lead-out electrode (fourth electrode)
46 Signal conversion part
47 Memory

The invention claimed is:

1. A radiation imaging device comprising:
a radiation detector having an electric charge generation part configured to generate an electric charge corresponding to energy of incident radiation or the number of particles and a reading part configured to output a digital value based on the electric charge; and
a circuit board in which a plurality of radiation detectors are disposed two-dimensionally,
wherein the reading part includes a lead-out substrate in which a plurality of signal processing parts configured to output the digital values are disposed two-dimensionally, and
a plurality of intermediate substrates disposed between the electric charge generation part and the lead-out substrate and including a first main surface configured to face the electric charge generation part and a second main surface configured to face the lead-out substrate,
a plurality of first electrodes electrically connected to the electric charge generation part are disposed on the first main surface,
a plurality of second electrodes electrically connected to each of the signal processing parts and the first electrodes of the lead-out substrate are disposed on the second main surface, and
an arrangement interval of the plurality of second electrodes is narrower than an arrangement interval of the plurality of first electrodes,
the lead-out substrate includes
an input part including third electrodes electrically connected to the second electrodes of the intermediate substrate and in which the intermediate substrate is disposed, and an output part including fourth electrodes electrically connected to the circuit board and provided adjacent to the input part,
an exterior of the intermediate substrate in a plan view is smaller than an exterior of the electric charge generation part in a plan view,
the fourth electrodes are through electrodes configured to reach a rear surface of the lead-out substrate whereon the output part is formed from a main surface of the lead-out substrate whereon the input part is formed,
a plurality of pixel blocks including the plurality of second electrodes are formed on the second main surface, and
an interval of the pixel blocks that are mutually adjacent is larger than the arrangement interval of the second electrodes.

2. The radiation imaging device according to claim 1, wherein an exterior of the lead-out substrate in a plan view is smaller than an exterior of the electric charge generation part in a plan view.

3. The radiation imaging device according to claim 1, wherein an exterior of the intermediate substrate in a plan view is larger than an exterior of the electric charge generation part in a plan view.

4. The radiation imaging device according to claim 1, wherein an exterior of the lead-out substrate in a plan view is larger than an exterior of the electric charge generation part in a plan view.

5. The radiation imaging device according to claim 1, wherein the first electrodes are disposed according to a first arrangement interval and a second arrangement interval different from the first arrangement interval.

6. The radiation imaging device according to claim 1, wherein the second electrodes are disposed according to a third arrangement interval and a fourth arrangement interval different from the third arrangement interval.

* * * * *